US008370721B2

(12) United States Patent  
Arye

(10) Patent No.: US 8,370,721 B2  
(45) Date of Patent: Feb. 5, 2013

(54) METHOD AND SYSTEM FOR SENSING AVAILABLE BANDWIDTH OVER A BEST EFFORT CONNECTION

(75) Inventor: Ram Arye, Rishon-le-Zion (IL)

(73) Assignee: Celtro Ltd, Petach Tikva (IL)

( * ) Notice: Subject to any disclaimer, the term of this patent is extended or adjusted under 35 U.S.C. 154(b) by 628 days.

(21) Appl. No.: 12/614,593

(22) Filed: Nov. 9, 2009

(65) Prior Publication Data

US 2010/0122141 A1     May 13, 2010

Related U.S. Application Data

(60) Provisional application No. 61/113,462, filed on Nov. 11, 2008.

(51) Int. Cl.  
     *G06F 11/00* (2006.01)
(52) U.S. Cl. .................... 714/774; 714/752; 714/786
(58) Field of Classification Search ............ 714/752, 714/774, 786  
See application file for complete search history.

(56) References Cited

U.S. PATENT DOCUMENTS

| | | | |
|---|---|---|---|
| 6,253,346 B1 | 6/2001 | Kim et al. | |
| 6,539,031 B1 | 3/2003 | Ngoc et al. | |
| 6,754,179 B1 | 6/2004 | Lin | |
| 7,257,664 B2 * | 8/2007 | Zhang | 714/748 |
| 7,369,510 B1 | 5/2008 | Wong et al. | |
| 8,091,011 B2 * | 1/2012 | Rajakarunanayake et al. | 714/774 |
| 2003/0198155 A1 | 10/2003 | Go et al. | |
| 2006/0150055 A1 * | 7/2006 | Quinard et al. | 714/752 |
| 2007/0204196 A1 * | 8/2007 | Watson et al. | 714/751 |

* cited by examiner

*Primary Examiner* — Marc Duncan  
(74) *Attorney, Agent, or Firm* — Smith Risley Temple Santos LLC; Gregory Scott Smith

(57) ABSTRACT

A bandwidth sensing system operates to sense the existence of additional bandwidth available for transmitting data over a best effort communication. The operations include receiving an original block of data from a transmitting node and calculating error correction data based on the original block of data. The original block of data and the error correction data is then transmitted toward a receiving node. The data may be simply appended or, the entire block may be modified during the error correction data process. When the original block of data and error correction data is received at the receiving end associated with the receiving node, the data is analyzed to determine if any errors occurred in the transmission. If so, the error correction data is used to maintain the integrity of the transmitted data by restoring the original block. However, if no errors are detected, because the error correction data inherently requires the transmission of additional data, the receiving end can conclude that additional bandwidth is available over the channel. Thus, the transmitting node can be notified of the available bandwidth so that additional bandwidth can be utilized on subsequent transmissions.

24 Claims, 4 Drawing Sheets

METHOD AND SYSTEM FOR SENSING AVAILABLE BANDWIDTH OVER A BEST EFFORT CONNECTION

CROSS-REFERENCE TO RELATED APPLICATIONS

This application is being filed under 35 USC 111 and 37 CFR 1.53(b) and claims the benefit of the filing date of the U.S. Provisional Application for patent that was filed on Nov. 11, 2008 and assigned Ser. No. 61/113,462, which application is hereby incorporated by reference in its entirety.

BACKGROUND

The present disclosure generally describes communication networks, and more particularly data communication over best effort networks.

The rapid evolution of communication networks creates a significant demand for bandwidth from a service provider. A service provider can be a cellular operator, a Public Switched Telephone Network (PSTN) operator, a data network operator, an access network service provider, an Internet Service Provider (ISP), etc. A common network of a service provider can include a central premises, a plurality of intermediate nodes, and a plurality of subscribers. In a common network, one side of an intermediate node is connected to the customers or subscribers and the other side is connected to the central premises directly or via other intermediate nodes. The network that connects the central premises and the intermediate nodes can be referred to as the infrastructure of the service provider or, as the fixed network of the service provider.

An exemplary service provider can be an operator of wireless communication networks for mobile communications, such as but not limited to, the Global System for Mobile communications (GSM) networks, 3G networks, etc. A common fixed network of a wireless communication network operator can include a Radio Network Controller (RNC) located in a central premises and a plurality of node base stations (Node Base, Nb), which are spread all over the country as intermediate nodes.

Henceforth, the description, drawings and claims of the present disclosure may use the term RNC as a representative term for a central node and an Nb as a representative term for an intermediate node. Exemplary mobile terminals (MT) can be a cellular telephone or device, a PDA with cellular capabilities, or any other computerized device that can generate and/or receive audio, video, data or any combination thereof via a communication network such as but not limited to cellular network.

Usually, an RNC is used as an aggregation point for different types of data transferred to and from a plurality of MT. It can receive circuit switch telephony traffic as well as packet switched traffic traveling to and from the Internet, for example. Usually, a communication line between a central point and an intermediate node, or between intermediate nodes, can carry a plurality of communication sessions with different types of media. Different types of networks and protocols can be used over the communication lines. The communication lines can comply with different types of data link layer protocols, such as but not limited to: Time Division Multiplexing Access (TDMA), Asynchronous Transfer Mode (ATM), Ethernet, Internet, etc.

A growing number of communication links in an infrastructure of a service provider are based on the data link layer and/or network layer protocols that are "Best Effort Delivery" protocols. Exemplary best effort delivery protocols can be the ATM, the Ethernet, Internet, etc. A "Best Effort Delivery" network does not guarantee that data will be delivered during a certain period of time or that data will be delivered at all. In a best effort delivery network, users obtain best effort service, meaning that they obtain unspecified success, variable bit rate and unspecified delivery times. Thus, the current service depends on the current traffic load over the network. As a consequence, best effort delivery networks are more efficient and less expensive. On the other hand, the quality of service is reduced in that users may experience symptoms such as missing data, long delays, etc.

Because the current quality of service in a network depends on the current traffic load over the network, it would be effective for a common transmitting node to have the ability to sense the existence of any extra available bandwidth. The ability to sense the currently available bandwidth over the network can be used to utilize the available bandwidth in order to reduce delivery time of the data and to improve the user's experience (i.e., less delays in data delivery). Usually, such a method for sensing the existence of any extra available bandwidth is executed in higher layers of the OSI (Open Systems Interconnection) model, such as at the transport layer or at the application layer, for example.

Different methods are used to sense the existence of any extra available bandwidth. The TCP protocol, which is a connection-oriented protocol, starts with a high level of bandwidth consumption and then slowly reduces the bandwidth consumption according to the amount of detected packets lost. The bandwidth consumption is reduced until a steady state speed is reached in which packets are reliably delivered. Then, the process of sensing for the existence of any extra available bandwidth is executed by increasing the consumption in small percentages or increments at each cycle until an indication of a missed packet is received. Once an indication of a missed packet is received, then the missed packet is retransmitted and the bandwidth consumption is reduced. Consequently, the bandwidth consumption is alternated around the steady state value in a small percentage or increment depending on the current detection of missing packets. To prevent missing information, any missed packets are resent.

A common UDP does not attempt to sense for the existence of any extra available bandwidth, and therefore, it may lose an opportunity to increase its bandwidth consumption.

Common techniques for sensing the existence of any extra available bandwidth generally result in causing missing packets in their process. Thus, missing packets is a limitation of such common techniques. Further, these common techniques may increase the load on the network because retrials are needed to resend the missing information. In real time communication, missing packets can adversely affect the user's experience. For instance, in a voice communication session, the user may miss part of the conversation. In video sessions, to recover from a missing packet an Intra frame may be requested from the sender. An Intra frame is a compressed frame, which is not related to any previous frame, and therefore it requires more bandwidth and more computing resources. Therefore, there is a need in the art for a method and a system that can sense and utilize any extra available bandwidth over a best effort communication link without losing information.

BRIEF SUMMARY

Exemplary embodiments of an apparatus and/or method for sensing for extra available bandwidth (bandwidth sensors) over a best effort communication link (BECL) between a transmitting node and a receiving node are now presented in this disclosure. Further, in an exemplary bandwidth senor, the sensing process is executed without losing information. Such an exemplary bandwidth sensor can comprise a transmitting bandwidth consumption sensing module (TBCSM) in association with the transmitting node and a receiving bandwidth consumption sensing module (RBCSM) in association with receiving node. Upon determining that the bandwidth consumption over the BECL (best effort communication link) can be increased, the TBCSM can engage a forward error correction encoding module (FECEM) in the path of the transmitting data. The FECEM can process the data that is transmitted over the BECL. In one embodiment, the decision as to when to check for any extra available bandwidth can be based on a configurable timer. In another embodiment, this decision can be based on feedback received from the RBCSM indicating that there are no missing packets. Yet in an alternate embodiment both methods can be used.

The FECEM can arrange the stream of the transmitted data segments into groups (blocks) of data segments. To each group (block) of data segments, the FECEM can add one or more segments of forward error correction (FEC) data. The number of segments of the FEC data can be adapted to the current conditions over the BECL (best effort communication link). The number of FEC segments can be adapted to correct one or more errors within one or more data segments that reached the RBCSM, as well as restoring one or more missing data segments that have not reached the RBCSM. More details on the process are detailed below. Furthermore, the portion of the segments of the FEC data out of the number of data segments in the group can reflect the percentage of an extra available bandwidth that is currently under test. It should be noted that the terms "group of segments", "block", "group", and "block of segments" can be used interchangeably.

In the other end of the BECL, in association with the receiving node, the RBCSM can engage an FEC decoder module (FECDM) serially to the communication path. The FECDM can decode the segments of the FEC data and identify and correct one or more errors within data segments in the received group of segments. The FECDM can determine whether one or more segments of data or the FEC data are missing and can restore the missing data segments. The restored group of data segments is transferred toward the receiving node. It should be noted that the terms "communication data", "data communication", and "data" can be used interchangeably.

The FECDM can send a report about the errors and the number of restored missing data segments to the TBCSM. The TBCSM can respond by adapting the FEC algorithm to increase or decrease the number of FEC segments or the number of data segments in each group of data segments. By adjusting the FEC algorithm, the portion of the bandwidth consumption that is under test is changed. Furthermore, after determining that the extra available bandwidth is stable and can be used, the TBCSM can provide an indication to the transmitting node that the bandwidth consumption may be increased. The FECEM (FEC encoding module) and the FECDM (FEC decoding module) can be disengaged from the communication path until a new cycle of bandwidth sensing is needed. In one embodiment, the decision as to when to check for any extra available bandwidth can be based on a configurable timer. In another embodiment, the decision can be based on feedback received from the RBCSM indicating that there are no missing packets. Yet in an alternate embodiment both methods may be used.

Different types of FEC algorithms can be used, by an exemplary FECEM and FECDM pair, to check and correct errors and/or missing segments in a block of data segments. One exemplary FECEM and FECDM pair can use a cyclic redundancy check (CRC) algorithm as the FEC algorithm. An exemplary algorithm can handle the block of data segments as a matrix of bits in which each line includes the bits of each data segment. The exemplary FECEM can calculate a CRC value per each data segment (CRC for each line in the matrix). The CRC values of the data segments can be embedded within one or more FEC-lines-segments at the end of the block. In addition a CRC value can be calculated per each column of bits in the block and the one or more FEC-column-segments can be added after the FEC-lines-segments, for example.

Another exemplary embodiment can use the Reed-Solomon (RS) algorithm for each block of data segments, for example. The additional RS data can be added to the end of the block of data segments as the additional-FEC-segments. Other embodiments of the present invention can use other FEC methods. Because FEC methods are well known in the art and have been in use since the early seventies of the twenty century they are not further described. A reader who wishes to learn more about FEC methods is invited to read technical books.

The foregoing summary is not intended to summarize each potential embodiment or every aspect of the present disclosure, and other features and advantages of the present disclosure will become apparent upon reading the following detailed description of the embodiments with the accompanying drawings and appended claims.

Furthermore, although specific exemplary embodiments are described in detail to illustrate the inventive concepts to a person skilled in the art, such embodiments can be modified to various modifications and alternative forms. Accordingly, the figures and written description are not intended to limit the scope of the inventive concepts in any manner.

BRIEF DESCRIPTION OF THE SEVERAL VIEWS OF THE DRAWING

Exemplary embodiments of the present invention will be understood and appreciated more fully from the following detailed description, taken in conjunction with the drawings in which.

DETAILED DESCRIPTION OF EMBODIMENTS OF THE INVENTION

Turning now to the figures in which like numerals represent like elements throughout the several views, exemplary embodiments of invention bandwidth sensor, as well as features and aspects thereof are described. For convenience, only some elements of the same group may be labeled with numerals. The purpose of the drawings is to describe exemplary embodiments and is not for production purposes. Therefore, features shown in the figures were chosen only for convenience and clarity of presentation.

In general, embodiments of the bandwidth sensing system operate to sense the existence of additional bandwidth available for transmitting data over a best effort communication link between a transmitting node and a receiving node while maintaining the data integrity of the transmitted data. Typically, various embodiments perform this function over a communication link that is based on the open system interconnection (OSI) protocols but, the various aspects may be applied in other communication links as well. The operations include receiving an original block of data from a transmitting node and calculating error correction data based on the original block of data. The original block of data and the error correction data is then transmitted toward a receiving node. The data may be simply appended or, the entire block may be modified during the error correction data process. When the original block of data and error correction data is received at the receiving end associated with the receiving node, the data is analyzed to determine if any errors occurred in the transmission. If so, the error correction data is used to maintain the integrity of the transmitted data by restoring the original block. However, if no errors are detected, because the error correction data inherently requires the transmission of additional data, the receiving end can conclude that additional bandwidth is available over the channel. Thus, the transmitting node can be notified of the available bandwidth so that additional bandwidth can be utilized on subsequent transmissions.

Figure 1:
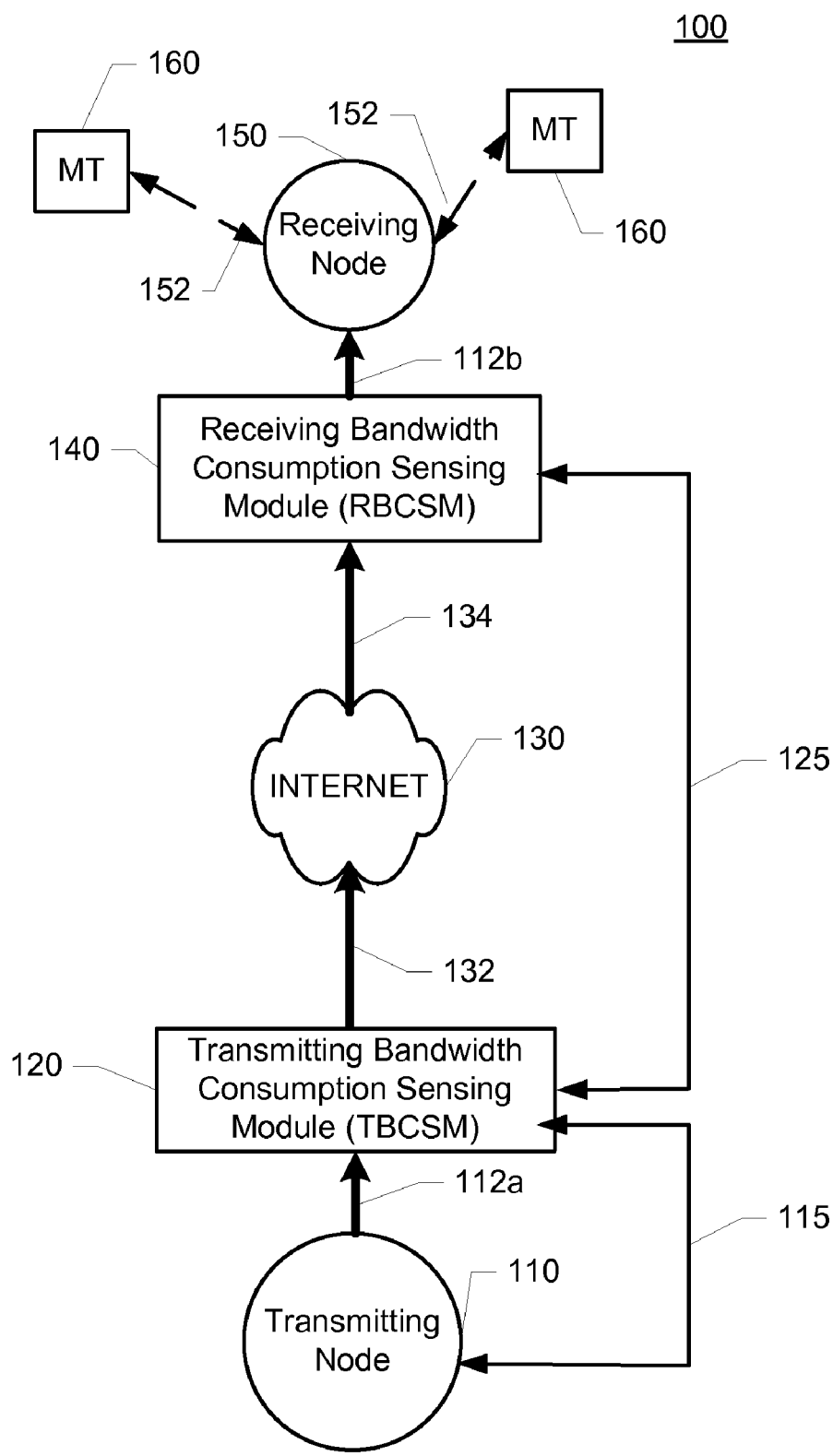
FIG. 1 is a simplified block diagram illustrating an exemplary portion of a communication network in which an exemplary embodiment of the bandwidth sensor can be used.

FIG. 1 depicts a block diagram with relevant elements of an exemplary communication system 100 that is a suitable environment for implementing exemplary embodiments of the present invention. Communication system 100 may comprise a plurality of intermediate nodes, such as but not limited to, a Transmitting Node 110 and a Receiving Node 150. The Transmitting Node 110 can be a Radio Network Controller (RNC) for a cellular service provider, for example. Non-limiting examples of other service providers include Internet service providers (ISP), public switched telephone network (PSTN) operators, data network operators, access network service providers, etc. The Receiving Node 150 can be Node Base (Nb), for example. The Receiving Node 150 can be connected to a plurality of Mobile Terminals (MT) 160 through wireless links 152, for example.

In the example of FIG. 1, the Transmitting Node 110 can be associated with a Transmitting Bandwidth Consumption Sensing Module (TBCSM) 120. The communication data can be transmitted from Transmitting node 110 to TBCSM 120 via a link 112a. Link 112a can be a wired link or a wireless link, for example. In another embodiment, the TBCSM 120 can be embedded in the Transmitting Node 110 itself. The TBCSM 120 can also send and receive status, control and feedback information from the Transmitting Node 110 via a connection 115. Connection 115 can be an in-band (within communication link 112a) or an out-of-band connection or channel.

The communication from the TBCSM 120 toward a Receiving Bandwidth Consumption Sensing Module (RBCSM) 140 can be carried over an Internet 130 or a Circuit Switch Network link or any type of point to point physical link, for example. Link 132, from the TBCSM to the Internet 130, the Internet itself and link 134, from the Internet 130 to RBCSM 140 are best effort communication links (BECL). Links 132 and 134 can be implemented in many different forms such as, but not limited to: wireless links, twisted pairs links, fiber optic links, etc.

An exemplary Receiving Bandwidth Consumption Sensing Module RBCSM 140 is capable of restoring the information received. The RBCSM 140 communicates with the TBCSM 120 via connection 125. Connection 125 can be an in-band or an out-of-band. The communication between the TBCSM 120 and the RBCSM 140 can include control commands, status and feedbacks. The RBCSM 140 can also detect and restore lost packets. More information on the operation of the TBCSM 120 and the RBCSM 140 is disclosed below in conjunction with FIG. 3, and FIG. 4.

The RBCSM 140 is associated with the Receiving Node 150. The association can be via a Link 112b. The communication data can be passed through link 112b. Link 112b can be a wired link or a wireless link. In another embodiment, the RBCSM 140 can be embedded in the Receiving Node 150 itself. The Receiving Node 150 can be connected to a plurality of Mobile Terminals (MT) 160 through wireless links 152, for example.

For a bi-directional communication link between the Transmitting Node 110 and the Receiving Node 150, an exemplary embodiment of the bandwidth sensor can use a TBCSM 120 and RBCSM 140 pair in association with each one of the nodes, instead of just a TBCSM 120 or just a RBCSM 140 associated with each one of the nodes. Another exemplary embodiment of the bandwidth sensor can use one module that combines elements of a TBCSM 120 and a RBCSM 140. Such a combined module can be referred as a Combined Transmitting and Receiving Bandwidth Consumption Sensing Module (CTRBCSM). A CTRBCSM can be installed in association with each one of the nodes 110 and 150, for example.

In an exemplary embodiment, the TBCSM 120 acts as the master of the RBCSM 140. In this role, the TBCSM 120 can decide when to start a sensing process for extra bandwidth between Transmitting Node 110 and Receiving Node 150. As it was described before, the timing of when to sense can be based on a timer or on feedback from the RBCSM 140, or both. The TBCSM 120 can notify the RBCSM 140 upon the initiation of the sensing procedure via link 125. During the extra bandwidth sensing procedure, the TBCSM 120 can determine a block size and add additional FEC (Forward Error Correction) segments to the data segments. The TBCSM 120 can also add a header and a tail to the block. During the extra bandwidth sensing procedure, the RBCSM 140 can decode the received blocks, correct bits and/or restore missing packets. The RBCSM 140 transfers the data segments according to the OSI (open system interconnection) protocol to the Receiving Node 150 via link 112b. The RBCSM 140 sends feedback to the TBCSM 120 via link 125. The feedback can include a variety of information and a non-limiting example may include the number of restored packets (lost packets and defective packets), for example. Based on the received feedback, the TBCSM 120 can determine whether extra bandwidth is available. In the case that the TBCSM 120 senses that extra bandwidth is available, the TBCSM 120 can notify the Transmitting Node 110 via link 115, for example, to increase the bandwidth consumption. In another exemplary embodiment, the Transmitting Node 110 can request or invoke the TBCSM 120 to start the extra bandwidth sensing procedure.

An exemplary embodiment of an extra bandwidth sensing procedure can define a block of data comprising data segments with additional segments. The additional segments can be FEC (forward error correction) segments, header segments and tail segments. The block can be referred to as a matrix or array. For each row of the matrix (which is a data segment) a CRC is calculated. For each column of the matrix a CRC is also calculated. At the end of the block the additional FEC segments are added. In one embodiment, the FEC segments can be of two kinds, for example. One kind of FEC segment can comprise the calculated CRC of the matrix's lines (the data segments), which will be referred as FEC-lines-segments. The second kind of FEC segment can comprise the calculated CRC of the matrix's data columns, which will be referred as FEC-columns-segments. For each block, a header and a tail can be added, with information for the RBCSM 140. The information can be for example: the block size, the number of FEC-lines-segments and there location in the block, the number of FEC-columns-segments and there location in the block, and so on.

The additional FEC segments, together with the headers and tails can be considered as the extra bandwidth that is currently examined (sensed). If, for example, the ratio between the additional segments (FEC, headers, and tails) and the data segments is 1:5 meaning 20 percent, and the RBCSM 140 feedback is "no packets were lost and/or needed restoration" than the extra bandwidth that can be added to the connection is 20 percent. The TBCSM 120 can update the transmitting node 110 that it can exploit 20 percent more bandwidth. It should be noted that the terms "block of data", "block", "group", and "block of segments", "matrix", "array" can be used interchangeably. In another embodiment, the Reed-Solomon technique can be used for calculating the FEC of a block of data segments.

Figure 2:
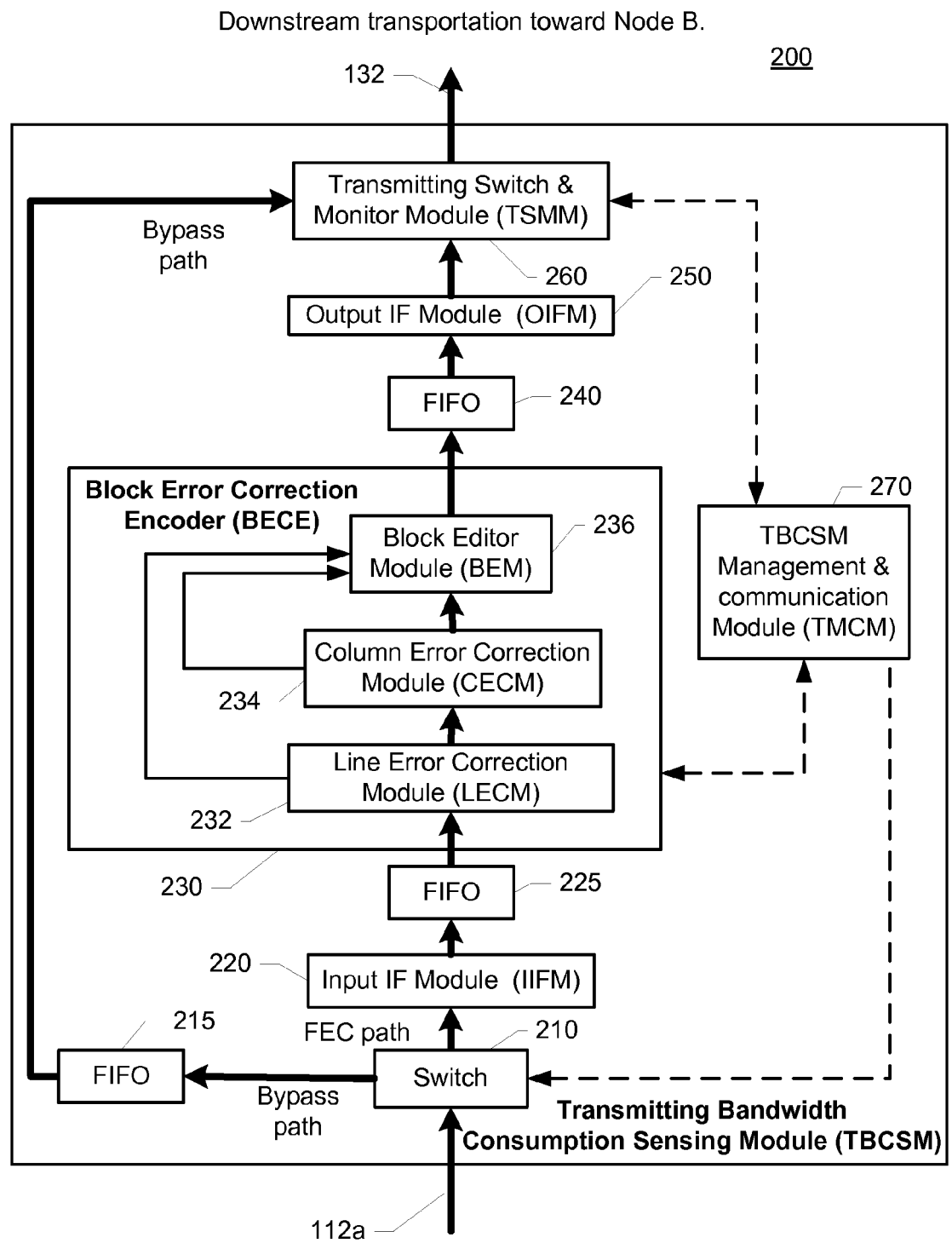
FIG. 2 schematically illustrates a simplified block diagram with relevant elements of an exemplary Transmitting Bandwidth Consumption Sensing Module (TBCSM) that operates according to certain exemplary techniques of the present disclosure.

FIG. 2 is a block diagram with relevant elements of an exemplary implementation of the Transmitting Bandwidth Consumption Sensing Module 200. The TBCSM 200 can have three sections: transportation of data, FEC encoder section, and management. The data transportation is executed via a Switch 210, a plurality of FIFOs 215, 225, 240, and a Transmitting Switch and Monitoring Module 260 (TSMM). The FEC encoder section can comprise a Block Error Correction Encoder (BECE) 230, an input interface module (IIFM) 220 and an output interface module (OIFM) 250. The management section of the TBCSM 200 comprises a TBCSM Management and Communication Module 270 (TMCM).

The link 112a, at the ingress of the TBCSM 200 forwards the communication data from an intermediate node, Transmitting Node 110 (FIG. 1) for example. The communication data first enters a switch 210. The switch 210 can pass the data either to the Input Interface Module (IIFM) 220, placed at a FEC path, or it can pass the data to a FIFO 215 in a bypass path. In the case that the extra bandwidth sensing procedure is not activated, than the communication data will be passed through the bypass path, meaning through FIFO 215. From FIFO 215 the communication data is transferred to a Transmitting Switch and Monitor Module (TSMM) 260 at the output of the TBCSM 200, and passed as downstream transportation toward the next node, Receiving Node 150 (FIG. 1), for example.

In the case that the extra bandwidth sensing process is activated, the TBCSM Management and Communication Module 270 (TMCM) alters first the switch 210 to transfer its input communication data to the Input Interface Module (IIFM) 220 (meaning through the FEC path). Once FIFO 215 is drained, the TMCM 270 alters the switch TSMM 260 to the FEC path.

In one embodiment, the Input Interface Module (IIFM) 220 parses the physical layer, data link layer and the network layer of the received OSI (Open System Interconnection) communication according to known used protocols and transfers transport protocol data segments to FIFO 225. In another embodiment, the IIFM 220 can further process the transport protocol segments, for example it can divide or combine the segments to a new predefined segment length. Yet in another embodiment, the IIFM 220 can process the physical layer, data link layer and delivers IP packets, for example, to FIFO 225 as the data segments to be processed by the BECE 230. In an alternate exemplary embodiment, the IIFM 220 can process only the physical layer and then deliver ATM cells, for example, as data segments. Next the IIFM 220 transfers the segments to FIFO 225. From the FIFO 225, the data segments are transferred to the Block Error Correction Encoder (BECE) 230.

An exemplary Block Error Correction Encoder (BECE) 230 can arrange the data segments into a block and calculate a CRC for each line and column in the block. In an exemplary embodiment, the length of the lines in the block is the length of the data segments received from the FIFO 225. The received data segments in the input of the BECE 230 are transferred to a Line Error Correction Module 232 (LECM). The LECM 232 calculates the CRC of each data segment (each line of the formed block). Each calculated line-CRC can be added at the end of that line (the end of the data segment). In another embodiment, the CRC of each line can be stored in a memory and be added as lines CRC FEC segments at the end of the block. Next the data segments are passed through Column Error Correction Module (CECM) 234. The CECM 234 calculates the CRC of the columns of the formed block. Each calculated column-CRC can be added at the end of the column. In another embodiment, the CRC of each column can be stored in a memory.

In an embodiment of the bandwidth sensor in which FEC values are stored in a memory, then after calculating the CRC values of the lines and the columns of the data segments in the block, the line's CRC values, and the column's CRC values are fetched from the memory, edited into FEC segments to be added to the end of the block by a Block Editor Module (BEM) 236. The FEC-lines-segments and FEC-columns-segments are at the same length as the data segments. Next, BEM 236 adds the FEC-segments as lines in the enlarged block after the last data segment (line). Block editor module (BEM) 236 can also add headers and tails to the block. The extra segments (the FEC segments, the header and the tail segments) can comply with the protocol of the data segments according to the OSI layer that is delivered by IIFM 220.

An exemplary header segment can be implemented such that it defines the block size, the number of FEC-lines-segments, the number of FEC-column-segments, etc. The last bits of the header segment can be the value of a sequential counter. An exemplary tail can be implemented such that the receiving bandwidth consumption sensing module 140 (FIG. 1) will know that the enlarged block has ended, for example. The enlarged block can include the original communication data that was transmitted from transmitting node 110 (FIG. 1) and the extra data that was added by BECE 230. The extra data can comprise the FEC segments, the header segment and tail segment.

Once the Block Editor Module 236 completes the editing of the enlarged block, the enlarged block can be sent through FIFO 240 to the Output Interface Module 250 (OIFM). The enlarged block will be transferred from the FIFO 240 once the TSMM 260 is altered to the FEC path.

An exemplary OIFM 250 executes the inverse operation of the IIFM 220 and converts the received enlarged block from the OSI layer protocol (transport layer, network layer or data link layer) of the data segments (transport data segments, IP packets, ATM cells, respectively, for example) into the physical layer according to known OSI layer protocols. From the OIFM 250, the data (the communication data and the extra data) is transferred to the Transmitting Switch and Monitoring Module (TSMM) 260. At this phase, the TSMM 260 receives the data from the FEC path. The TSMM 260 transfers the data out of the TBCSM 200 toward the next node in the downstream transportation link. The TSMM 260 can also monitor the sent data, by counting the amount of packets or bits or segments, which are sent, and up-dating the TMCM 270. The TSMM 260 can count the number of bits sent, for example. In an alternate embodiment of the bandwidth sensor, the BECE counts the segments that are sent in an enlarged block.

As explained above, the FIFOs 215, 225, and 240 can be used as buffers when the TBCSM 200 changes from the bypass path through FIFO 215 to the FEC path through FIFO 225, BECE 230 and FIFO 240, and vice versa. The buffers can compensate for the latency of each path. The TBCSM Management and Communication Module 270 (TMCM) can instruct the Receiving Bandwidth Consumption Module 140 (RBCSM) (FIG. 1) to switch to the required mode. Exemplary modes can be: bypass mode or FEC (forward error correction mode) mode. The communication and management with RBCSM 140 (FIG. 1) can be done via link 125 (FIG. 1). Via link 125, the RBCSM 140 updates the TMCM 270 on the amount of bits received, on the number of packets lost and restored and so on. An exemplary TMCM 270 can be in charge of determining the amount of extra bandwidth to be sensed, and updates the BECE 230 with the relevant information. Exemplary relevant information can be: the ratio between the number data segments and the number FEC segments in the block, which FEC to use (i.e., Reed Solomon or CRC), the block size, etc.

Figure 3:
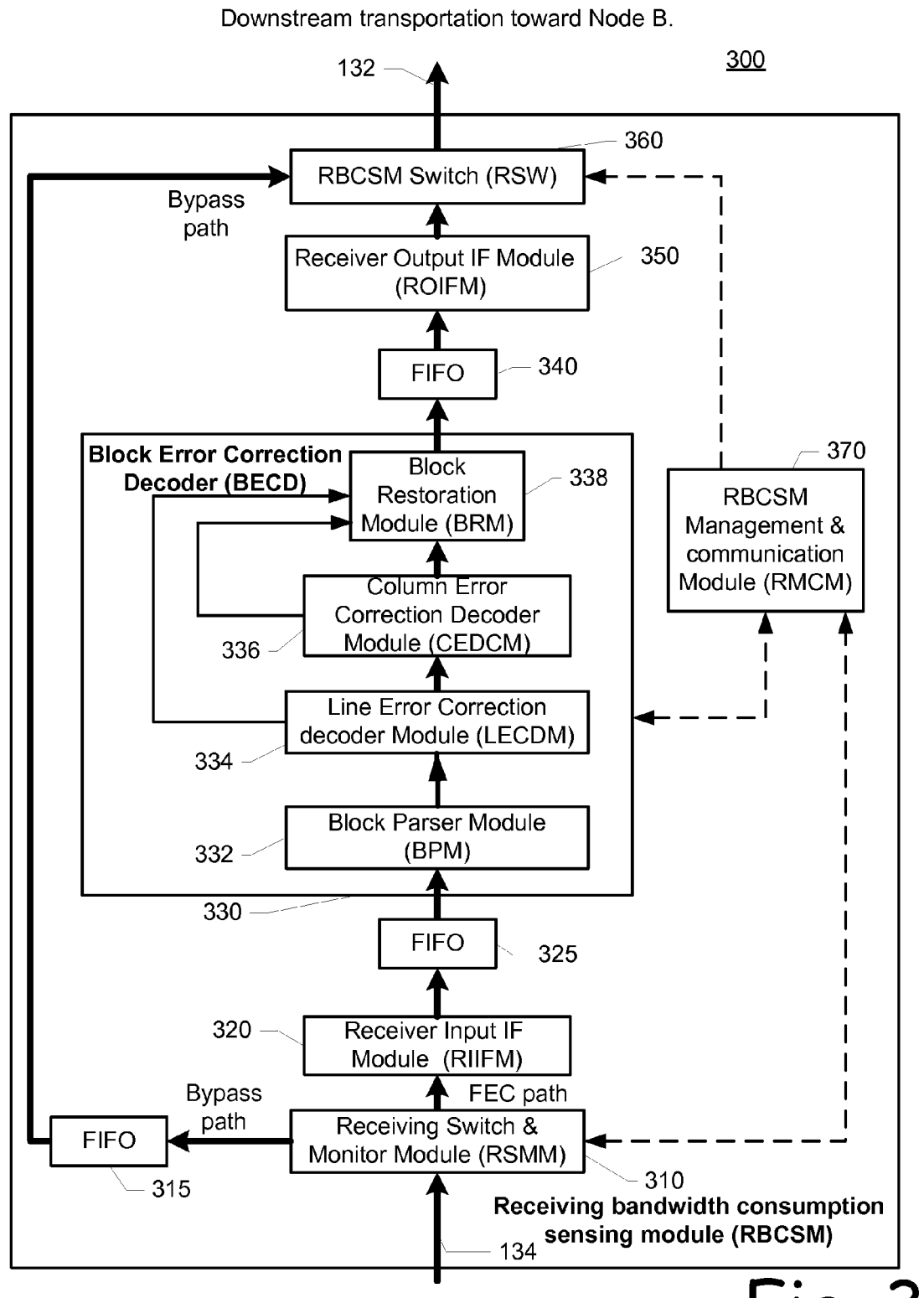
FIG. 3 schematically illustrates a simplified block diagram with relevant elements of an exemplary Receiving Bandwidth Consumption Sensing Module (RBCSM) that operates according to certain exemplary techniques of the present disclosure.

FIG. 3 schematically illustrates a simplified block diagram with relevant elements of an exemplary Receiving Bandwidth Consumption Sensing Module (RBCSM) 300 that operates according to certain exemplary techniques of the present disclosure. The RBSCM 300 acts as a mate of the TBCSM 200 (FIG. 2). The RBSCM 300 can have three sections: transporting data section, FEC decoding and correcting block errors section, and management section. The data transportation is executed via a Receiving Switch and Monitoring Module (RSMM) 310, a plurality of FIFOs 315, 325, 340 and an RBCSM switch (RSW) 360. For Block FEC decoding and correcting there is a Block Error Correction Decoder (BECD) 330, a Receiver Input Interface Module (RIIFM) 320, and a Receiver Output Interface Module (ROIFM) 350. The management of unit 300 is done by an RBCSM Management and Communication Module (RMCM) 370.

A best effort communication link 134, at the ingress of the RBCSM 300, forwards the downstream transportation sent from the Transmitting Node 110 via the TBCSM 120 (FIG. 1), for example. The data enters the RSMM 310. The RSMM 310 can pass the data either to the RIIFM 320, at the referred FEC path, or it can pass the data to a FIFO 315 at the referred bypass path. In the case that the extra bandwidth sensing procedure is not activated, than the data will be passed through the bypass path, meaning through FIFO 315. From FIFO 315, the data is transferred to the RSW 360 at the output of RBCSM 300, and sent as downstream transportation toward the Receiving Node 150 (FIG. 1).

In the case that the Extra bandwidth sensing procedure is activated, the RMCM 370 alters the RSMM 310 to transfer its input signal to the receiving input interface module (RIIFM) 320. And after the FIFO 315 is drained, the RMCM 370 alters the RSW switch 360 to the FEC path as well, enabling to receive data from the receiver output interface module 350 (ROIFM). The RSMM 310 can be capable of counting the amount of bits or segments or packets received and notifying the RMCM 370, which will notify the TMCM 270 (FIG. 2).

In one embodiment, the RIIFM 320 parses the physical layer, data link layer and the network layer of the received OSI (Open System Interconnection) communication according to known used protocols and transfers transport protocol data segments to the FIFO 325. In another embodiment, the RIIFM 320 can further process the transport protocol segments, for example it can divide or combine the segments to a new predefined segment length. Yet in another embodiment, the RIIFM 320 can process the physical layer and data link layer and deliver IP packets, for example, to the FIFO 325 as the data segments to be processed by the BECD 330. In an alternate exemplary embodiment of the bandwidth sensor, the RIIFM 320 can process the physical layer and delivers ATM cells, for example, as data segments. Next the RIIFM 320 transfers the segments to FIFO 325. From the FIFO 325 the segments are transferred to the Block error correction decoder (BECD).

At the input of an exemplary BECD 330, a Block Parser Module (BPM) 332 parses the received segments. The BPM 332 parses the header segment and tail segment to determine the block size, the number of FEC-lines-segments and there location in the block, the number of FEC-columns-segments and there location in the block, etc. The BPM 332 arranges each line-CRC in the relevant line and each column-CRC in the relevant columns. The BPM 332 deletes the FEC-lines-segments and the FEC-columns-segments. Next, the BPM 332 transfers the data segments, with the CRC in their new location, to Line Error Correction Decoder Module (LECDM) 334. An exemplary LEDCM 334 can calculate and compare the CRC for each line and updates a block restoration module (BRM) 338 with its findings. The LEDCM 334 forwards the data segments with the column CRC in their new location to a Column Error Correction Decoder Module (CEDCM) 336. An exemplary CEDCM 336 can calculate and compare the CRC for each column and updates the Block Restoration Module (BRM) 338 with its findings. An exemplary BRM 338 restores the data segments according to the findings received from both the LECDM 334 and the CEDCM 336 and forwards the corrected restored data segments through FIFO 340 to the receiver output interface module ROIFM 350. Then BRM 338, based on the information received in the header and the tail segments, determines whether or not packets were lost, damaged, and restored. A report on the findings can be transferred to the RBCSM 370 and from there to the TBCSM 270 (FIG. 2).

An exemplary ROIFM 350 executes the inverse operation of the RIIFM 320 and converts the received block from the OSI layer protocol (transport layer, network layer or data link layer) of the data segments (transport data segments, IP packets, ATM cells, respectively, for example) into the physical layer according to known OSI layer protocols. From the ROIFM 350, the communication data is transferred to the RSW 360. At this phase, the RSW 360 receives the data from the FEC path. The RSW 360 transfers the communication data out of the RBCSM 300 toward the receiving node 150 (FIG. 1) via link 112*b*.

It should be noted that the FIFOs 315, 325, and 340 can be used as buffers when the RBCSM 300 changes from the bypass path through FIFO 315 to the FEC path through FIFO 325, BECD 330 and FIFO 340 and vice versa. The buffers will enable the data in each path to reach the RSW 360 before the RSW 360 changes mode. The RMCM 370 acts as a slave of the TMCM 270 (FIG. 2). According to commands received from the TMCM 270 (FIG. 2) the RMCM 370 alters the switches, RSW 360 and RSMM 310, to the required mode. Exemplary modes can be: bypass mode or FEC (forward error correction mode) mode. The connection with the TMCM 270 (FIG. 2) can be done via link 125 (FIG. 1). The RMCM 370 can be updated on the amount of bits or segments or packets received from the RSMM 310, the number of packets lost, damaged and restored from BECD 330. Via link 125, the RMCM 370 updates the TMCM 270 on the amount of received data, on the number of packets lost, damaged and restored and so on. The RMCM 370 is updated from the TMCM 270 on relevant information. Exemplary relevant information can be: FEC parameters and algorithm, the ratio between the data segments and the FEC segments in the block, which FEC is used (i.e., Reed Solomon or CRC), the block size, etc.

In another embodiment of the bandwidth sensor the RMCM 370 can act as the master of the TMCM 270 (FIG. 2). In this embodiment, the RMCM 370 can be updated with information regarding the amount of data that was sent by the TBCSM 200 and the number of damaged or lost and restored packets from the RSMM 310 and/or BECD 330. Furthermore, the RMCM 370, as a master, can execute other functions of the TMCM 270, such as but not limited to, determine when to switch to the bypass mode and when to switch to the FEC path (Extra bandwidth sensing mode). The RMCM 370 can master the different switches such as, but not limited to: RSMM 310 and RSW 360 in the RBCSM 300, and switches 210 and TSMM 260 in the TBCSM 200 via TMCM 270.

Yet in an alternate embodiment, the management tasks can be shared between the two management modules TMCM 270 and RMCM 370.

Figure 4:
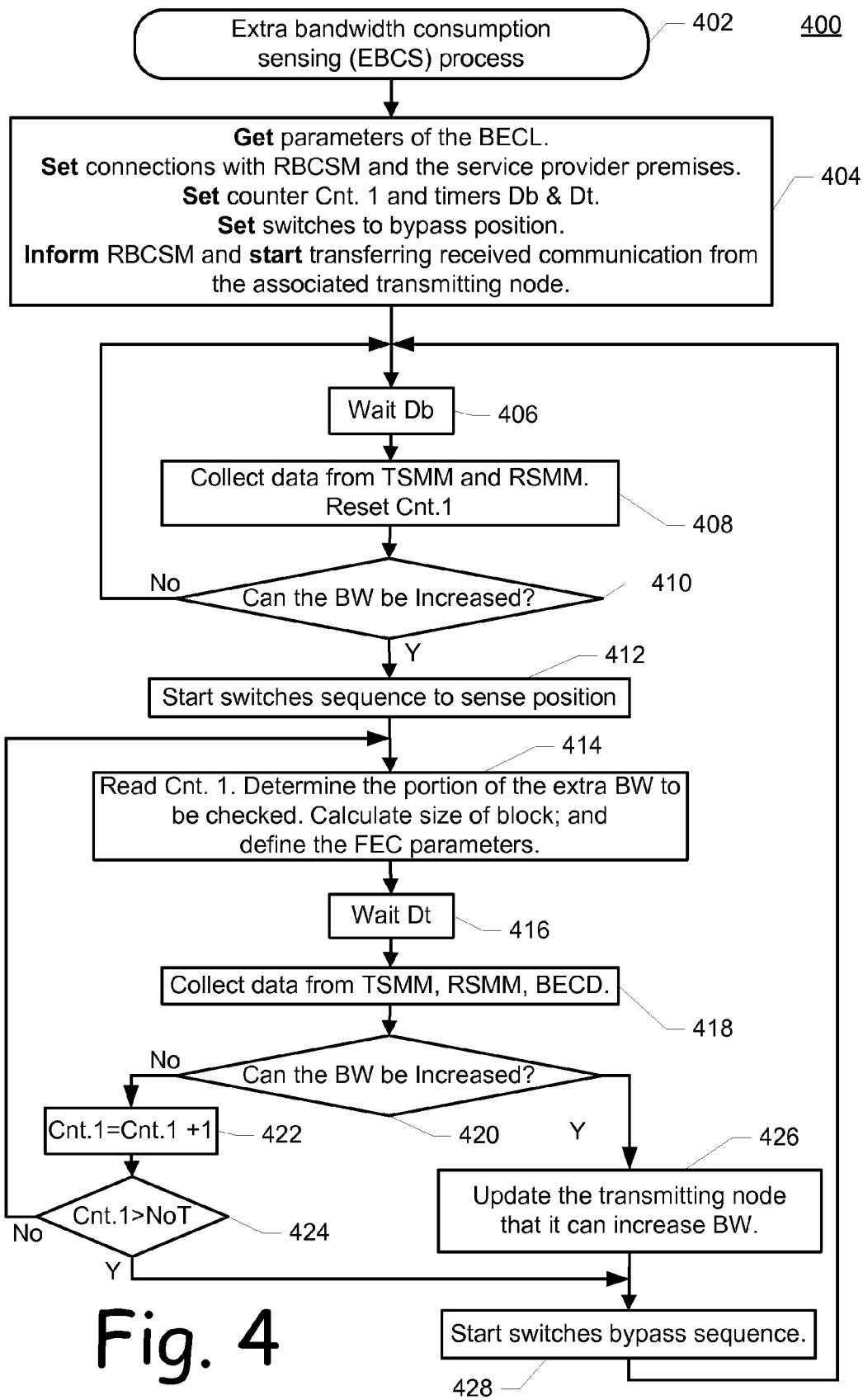
FIG. 4 schematically illustrates a flowchart showing relevant steps on the processes of sensing extra available bandwidth.

FIG. 4 schematically illustrates a flowchart showing relevant steps on the processes of sensing extra available bandwidth by presenting a flowchart of an exemplary method 400. Method 400 is an extra bandwidth consumption sensing process. Method 400 can be executed by the TBCSM 200 and the RBCSM 300, for example. Method 400 can be used for sensing the existence of any extra available bandwidth on a best effort communication link (BECL) between a Transmitting Node 110 (FIG. 1) and a Receiving Node 150 (FIG. 1), which can be exploited.

An exemplary method 400 may be initiated 402 by the TMCM 270 (FIG. 2) upon power on the device, rebooting, resetting, etc. During initialization 404 the TMCM 270 can be introduced to the components of the TBCSM 200 (FIG. 2). A connection with the Transmitting Node 110 (FIG. 1) via link 115 and a connection with the Internet 130 (FIG. 1) via BECL link 132 can be established. A connection to the RMCM 370 embedded in the RBCSM 300 (FIG. 3) via link 125 is also established. Further, the relevant resources can be allocated and reset. Exemplary resources can include a counter Cnt.1, timers Db and Dt, etc. The switches in the TBCSM 200 (FIG. 2) and the RBCSM 300 (FIG. 3) are set to the bypass mode (bypass path). The TMCM 270 can be updated from service provider or from Transmitting Node 110 (FIG. 1) with different parameters 404 such as, but not limited to, the bandwidth used at the BECL, for example. The RMCM 370 (FIG. 3) is informed, via link 125 (FIG. 1), that the extra bandwidth consumption sensing process is about to begin.

Method 400 waits 406 a based on timer Db (bypass mode) for a particular duration of time. The timer Db can be in the range of few milliseconds to a few thousands of milliseconds, for example. It can be for example between 10 milliseconds to 1000 milliseconds, depending on the maximum bandwidth of the best effort communication link. After the timer Db expires, the TMCM 270 (FIG. 2) collects 408 information from the TSMM 260 (FIG. 2) and the RSMM 310 (FIG. 3). The collected information can be the amount of segments or packets or bits received and the amount of segments or packets or bits lost during the normal operation (bypass mode), for example. Counter Cnt.1 is reset at this stage, as well.

Next, a decision is made 410 whether any extra bandwidth is available. The decision can be based on the collected information described above, or by past experience and trends, or the time passed from the previous sensing or any combination of the above, for examples. If, for example, packets are lost at the normal operation (bypass mode) then no extra bandwidth is available and there is no need to switch to the sensing mode (FEC mode). In another embodiment, the bandwidth can even be decreased when packets are lost at normal operation. If after a predefined number of cycles no packets are lost in the normal operation then bandwidth consumption can be increased. The TMCM 270 (FIG. 1) can use statistical methods on the collected data to assist in the decision, for example. The TMCM 270 can refer to past experience and trends such as, but not limited to, the day of the week, the hour of the day, and so on.

If 410 the bandwidth consumption cannot be increased, method 400 returns to step 406. If 410 the bandwidth consumption can be increased, method 400 proceeds to step 412. At step 412 the switches in both TBCSM 200 (FIG. 2) and RBCSM 300 (FIG. 3) are altered from the bypass path to the FEC path, for sensing for extra available bandwidth. The order in which the switches are altered can be for example: switch 210 (FIG. 2) changes from bypass path to FEC path (sensing mode), after FIFO 215 drains, TSMM 260 (FIG. 2) is changed to FEC path as well. Next RSMM 310 (FIG. 3) is changed to FEC path as well. After FIFO 315 drains, RSW 360 is changed to FEC path.

At step 414 counter Cnt.1 is read. Because method 400 tries different volumes of bandwidths, Cnt.1 counts the number of volumes of bandwidth that were tested. At step 414 the TMCM 270 (FIG. 2) can determine 414 the volume of the tested extra bandwidth, calculates the block size and defines the number of FEC segments to be added. According to the Cnt.1 value, the extra bandwidth to be tested (sensed if available) is determined. For example, if the Cnt.1 value is zero, method 400 can decide to test (sense) the availability of the maximum bandwidth. Extra bandwidth is the amount of extra bandwidth that can be added to the current bandwidth consumed. Other criteria that can be used by the TMCM 270 (FIG. 2) to determine the extra bandwidth to be tested are based on past experience: time of the day, day of the week, etc. The TMCM 270 (FIG. 2) forwards 414 the calculated information to the BECE 230 (FIG. 2) and to the RMCM 370 (FIG. 3) via link 125, for example.

Next method 400 waits 416 for the expiration of timer Dt, the test time (FEC mode). Timer Dt can be in the range of few hundred microseconds to a few milliseconds, for example. It can be for example between 100 microseconds to 10 milliseconds, depending on the maximum bandwidth of the best effort communication link. The TBCSM 200 starts sending data with the added FEC segments. The TMCM 270 (FIG. 2) can collect 418 information from the TSMM 260 (FIG. 2) regarding the number of sent packets or bit or segments, and from the RSMM 310 (FIG. 3), information, such as but not limited to the number of received packets or bit or segments, size of block and from the BECD 330 (FIG. 3), information on the amount of segments lost, damaged and restored.

Next a decision is made 420 whether any extra bandwidth is available. If 420 not, then the counter Cnt.1 value is incremented 422. Method 400 proceeds to step 424 were a decision is made whether the Cnt.1 value is greater than a predefined value NoT (number of trials). The predefined value NoT can be in the range of between one to ten, for example. If 424 the counter Cnt.1 value is less than NoT, then method 400 returns to step 414 and tries to sense for a different volume of bandwidth. If 424 the counter Cnt.1 value is more than NoT, then method 400 proceeds to step 428 meaning it stops the extra bandwidth sensing procedure and causes the switches to return to bypass mode.

Returning now to step 420, if bandwidth can be increased (there is an available extra bandwidth), then method 400 indicates 426 to the Transmitting Node 110 (FIG. 1) or the service provider that it can increase the bandwidth consumption in the amount calculated. Next, method 400 proceeds to step 428. At step 428 the switches in both the TBCSM 200 (FIG. 2) and the RBCSM 300 (FIG. 3) are altered from the FEC path to the bypass path, to return to normal operation (meaning no sensing for an extra available bandwidth). The order in which the switches are altered can be for example: First switch 210 (FIG. 2) is altered from FEC pat to bypass path. After FIFO 225 and FIFO 240 are drained, the TSMM 260 (FIG. 2) is altered to bypass path. Next RSMM 310 (FIG. 3) is altered as well to the bypass path. After FIFO 325 and FIFO 340 are drained then RSW 360 (FIG. 3) is altered to bypass path as well, and method 400 returns to step 406.

In the description and claims of the present application, each of the verbs, "comprise", "include" and "have", and conjugates thereof, are used to indicate that the object or objects of the verb are not necessarily a complete listing of members, components, elements, or parts of the subject or subjects of the verb.

In this application the words "unit" and "module" are used interchangeably. Anything designated as a unit or module may be a stand-alone unit or a specialized module. A unit or a module may be modular or have modular aspects allowing it to be easily removed and replaced with another similar unit or module. Each unit or module may be any one of, or any combination of, software, hardware, and/or firmware. Software of a logical module can be embodied on a computer readable medium such as a read/write hard disc, CDROM, Flash memory, ROM, etc. In order to execute a certain task a software program can be loaded to an appropriate processor as needed.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Many other ramification and variations are possible within the teaching of the embodiments comprising different combinations of features noted in the described embodiments.

It will be appreciated by persons skilled in the art that the present invention is not limited by what has been particularly shown and described herein above. Rather the scope of the invention is defined by the claims that follow.

What is claimed is:

1. A system that detects additional available bandwidth over a best effort communication link between a transmitting node and a receiving node, while maintaining reliable transfer of information over the best effort communication link, the system comprising:
    a transmitting bandwidth consumption sensing module in association with a transmitting node, the transmitting bandwidth consumption sensing module being configured to intercept data traffic sent from said transmitting node toward a receiving node over a best effort communication link, wherein the transmitting bandwidth consumption sensing module comprises a forward error correction encoder module which is configured to add forward error correction data to a predefined amount of communication data transmitted by said transmitting node each time additional available bandwidth is detected over said best effort communication link;
    a receiving bandwidth consumption sensing module that is associated with said receiving node and that is configured to intercept the data traffic sent from said transmitting bandwidth consumption sensing module over the best effort communication link, wherein the receiving bandwidth consumption sensing module comprises a forward error correction decoder module which is configured to restore the communication data that is received via the communication link,
    wherein the transmitting bandwidth consumption sensing module further comprises: a transmitting management and communication module that is configured to manage the transmitting bandwidth consumption sensing module, and wherein the transmitting management and communication module is further configured to determine when to sense the existence of additional available bandwidth and then activate a plurality of switches to engage the forward error correction encoder and decoder modules accordingly.

2. The system of claim 1, wherein transmitting bandwidth consumption sensing module further comprises:
    an input interface module that is configured to process the intercepted data traffic and deliver data segments to said forward error correction encoder module; and
    an output interface module that is configured to receive the data segments and the forward error correction data from said forward error correction encoder module, process the data segments and the forward error correction data and transmit the processed data toward said receiving node over a best effort communication link.

3. The system of claim 1, wherein the transmitting bandwidth consumption sensing module is embedded within the transmitting node.

4. The system of claim 1, wherein the receiving bandwidth consumption sensing module further comprises:
    a receiver input interface module that is configured to receive the processed data from the best effort communication link and transfer data segments and forward error correction data from the processed data toward said forward error correction decoder module; and
    a receiver output interface module that is configured to receive the restored data segments from the forward error correction decoder module, process the communication data and transmit the processed restored data segments toward the receiving node.

5. The system of claim 1, wherein the receiving bandwidth consumption sensing module is embedded in the receiving node.

6. The system of claim 1, wherein the receiving bandwidth consumption sensing module further comprises: a receiving management and communication module that is configured to manage the receiving bandwidth consumption sensing module and that is communicatively coupled with said transmitting management and communication module.

7. The system of claim 1, wherein the transmitting management and communication module is further configured to determine a ratio between the amount of forward error correction data to an amount of communication data.

8. The system of claim 1, wherein each transmitting bandwidth consumption sensing module and receiving bandwidth consumption sensing module pair are a combined module, and wherein one combined model is associated with the transmitting node and one combined module is associated with the receiving node.

9. The system of claim 1, wherein said data segments are Internet Protocol packets.

10. The system of claim 1, wherein said data segments are ATM cells.

11. The system of claim 1, wherein the transmitting management and communication module is further configured to indicate to the transmitting node the amount of additional available bandwidth.

12. The system of claim 1, wherein the receiving management and communication module is further configured to indicate to the transmitting node the amount of additional available bandwidth.

13. The system of claim 1, wherein the best effort communication link is bi-directional and the transmitting node and the receiving node, in each direction, is associated with a transmitting bandwidth consumption sensing module and receiving bandwidth consumption sensing module pair.

14. The system of claim 1, wherein said transmitting bandwidth consumption sensing module further comprises a bypass path.

15. The system of claim 1, wherein said receiving bandwidth consumption sensing module further comprises a bypass path.

16. A system that detects additional available bandwidth over a best effort communication link between a transmitting node and a receiving node, while maintaining reliable transfer of information over the best effort communication link, the system comprising:
  a transmitting bandwidth consumption sensing module in association with a transmitting node, the transmitting bandwidth consumption sensing module being configured to intercept data traffic sent from said transmitting node toward a receiving node over a best effort communication link, wherein the transmitting bandwidth consumption sensing module comprises a forward error correction encoder module which is configured to add forward error correction data to a predefined amount of communication data transmitted by said transmitting node each time additional available bandwidth is detected over said best effort communication link;
  a receiving bandwidth consumption sensing module that is associated with said receiving node and that is configured to intercept the data traffic sent from said transmitting bandwidth consumption sensing module over the best effort communication link, wherein the receiving bandwidth consumption sensing module comprises a forward error correction decoder module which is configured to restore the communication data that is received via the communication link, wherein the receiving bandwidth consumption sensing module further comprises: a receiving management and communication module that is configured to manage the receiving bandwidth consumption sensing module and that is communicatively coupled with said transmitting management and communication module, and wherein the receiving management and communication module is further configured to determine when to sense the existence of additional available bandwidth and then activate a plurality of switches to engage the forward error correction encoder and decoder modules accordingly.

17. A system that detects additional available bandwidth over a best effort communication link between a transmitting node and a receiving node, while maintaining reliable transfer of information over the best effort communication link, the system comprising:
  a transmitting bandwidth consumption sensing module in association with a transmitting node, the transmitting bandwidth consumption sensing module being configured to intercept data traffic sent from said transmitting node toward a receiving node over a best effort communication link, wherein the transmitting bandwidth consumption sensing module comprises a forward error correction encoder module which is configured to add forward error correction data to a predefined amount of communication data transmitted by said transmitting node each time additional available bandwidth is detected over said best effort communication link;
  a receiving bandwidth consumption sensing module that is associated with said receiving node and that is configured to intercept the data traffic sent from said transmitting bandwidth consumption sensing module over the best effort communication link, wherein the receiving bandwidth consumption sensing module comprises a forward error correction decoder module which is configured to restore the communication data that is received via the communication link, and
  wherein the best effort communication link is bi-directional and the transmitting node and the receiving node, in each direction, is associated with a transmitting bandwidth consumption sensing module and receiving bandwidth consumption sensing module pair.

18. A system that detects additional available bandwidth over a best effort communication link between a transmitting node and a receiving node, while maintaining reliable transfer of information over the best effort communication link, the system comprising:
  a transmitting bandwidth consumption sensing module in association with a transmitting node, the transmitting bandwidth consumption sensing module being configured to intercept data traffic sent from said transmitting node toward a receiving node over a best effort communication link, wherein the transmitting bandwidth consumption sensing module comprises a forward error correction encoder module which is configured to add forward error correction data to a predefined amount of communication data transmitted by said transmitting node each time additional available bandwidth is detected over said best effort communication link;
  a receiving bandwidth consumption sensing module that is associated with said receiving node and that is configured to intercept the data traffic sent from said transmitting bandwidth consumption sensing module over the best effort communication link, wherein the receiving bandwidth consumption sensing module comprises a forward error correction decoder module which is configured to restore the communication data that is received via the communication link, and
  wherein said transmitting bandwidth consumption sensing module further comprises a bypass path.

19. A system that detects additional available bandwidth over a best effort communication link between a transmitting node and a receiving node, while maintaining reliable transfer of information over the best effort communication link, the system comprising:
  a transmitting bandwidth consumption sensing module in association with a transmitting node, the transmitting bandwidth consumption sensing module being configured to intercept data traffic sent from said transmitting node toward a receiving node over a best effort communication link, wherein the transmitting bandwidth consumption sensing module comprises a forward error correction encoder module which is configured to add forward error correction data to a predefined amount of communication data transmitted by said transmitting node each time additional available bandwidth is detected over said best effort communication link;

a receiving bandwidth consumption sensing module that is associated with said receiving node and that is configured to intercept the data traffic sent from said transmitting bandwidth consumption sensing module over the best effort communication link, wherein the receiving bandwidth consumption sensing module comprises a forward error correction decoder module which is configured to restore the communication data that is received via the communication link, and wherein said receiving bandwidth consumption sensing module further comprises a bypass path.

20. A method for sensing the existence of additional available bandwidth over a best effort communication link between a transmitting node and a receiving node while maintaining information that is transferred over the communication link, the method comprising the steps of:

in association with a transmitting node:

transmitting via a bypass path, data toward a receiving node over a best effort communication link, at a first bandwidth consumption;

switching the transmitting from the bypass path to pass via a forward error correction path;

calculating forward error correction data based on a block of data that was transmitted from the transmitting node;

constructing an enlarged block of data that comprises the block of data that was transmitted from the transmitting node, and the forward error correction data;

transmitting the enlarged block of data toward the receiving node over the best effort communication link;

receiving, in association with the receiving node, a received enlarged block of data that is related to the transmitted enlarged block of data;

analyzing the received enlarged block of data using the forward error correction data to restore the block of data that was originally transmitted from the transmitting node;

transferring the restored block of data toward the receiving node;

if the forward error correction data is not required to restore the block of data, determining that additional bandwidth is available;

providing notice of additional bandwidth being available to the transmitting node; and the transmitting node increasing the bandwidth consumption for subsequent transmissions;

switching the transmitting from the forward error correction path to pass via the bypass path; and transmitting via the bypass path, data toward the receiving node over the best effort communication link, at a second bandwidth consumption that is larger than the first bandwidth consumption.

21. The method of claim 20, wherein prior to the calculating step, making a determination to test for additional bandwidth being available.

22. The method of claim 21, wherein the step of making a determination is function of time.

23. The method of claim 20, further comprising repeating the steps periodically.

24. A method for sensing the existence of additional bandwidth available for transmitting data over a best effort communication link between a transmitting node and a receiving node while maintaining the data integrity of the transmitted data, the method comprising the steps of:

in association with a transmitting node:

transmitting via a bypass path, data toward a receiving node over a best effort communication link, at a first bandwidth consumption;

switching the transmitting from the bypass path to pass via a forward error correction path;

receiving an original block of data from a transmitting node;

calculating error correction data based on the original block of data;

transmitting the original block of data and the error correction data toward a receiving node over a best effort communication link;

receiving at the receiving node, the original block of data and the error correction data;

analyzing the received original block of data and the error correction data to determine if any error occurred in the transmission;

if no errors are detected, notify the transmitting node that additional bandwidth can be utilized on subsequent transmissions;

switching the transmitting from the forward error correction path to pass via the bypass path; and transmitting via the bypass path, data toward the receiving node over the best effort communication link, at a second bandwidth consumption that is larger than the first bandwidth consumption.

* * * * *